(12) United States Patent
Bratfisch et al.

(10) Patent No.: US 7,825,839 B2
(45) Date of Patent: Nov. 2, 2010

(54) MEASURING DEVICE AND MEASURING METHOD FOR MEASURING THE POWER OF A HIGH-FREQUENCY SIGNAL

(75) Inventors: Toralf Bratfisch, Putzbrunn (DE); Christian Benisch, Augsburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 12/302,344

(22) PCT Filed: Apr. 26, 2007

(86) PCT No.: PCT/EP2007/003704
§ 371 (c)(1),
(2), (4) Date: Mar. 18, 2009

(87) PCT Pub. No.: WO2007/137659
PCT Pub. Date: Dec. 6, 2007

(65) Prior Publication Data
US 2009/0189593 A1 Jul. 30, 2009

(30) Foreign Application Priority Data
May 26, 2006 (DE) ........................ 10 2006 024 698
Aug. 14, 2006 (DE) ........................ 10 2006 038 030
Oct. 4, 2006 (DE) ........................ 10 2006 046 966

(51) Int. Cl.
*H03M 1/20* (2006.01)
(52) U.S. Cl. ........................ 341/131; 341/155; 341/143
(58) Field of Classification Search ................ 341/131, 341/143, 155, 144; 324/522
See application file for complete search history.

(56) References Cited

U.S. PATENT DOCUMENTS

| | | | |
|---|---|---|---|
| 4,447,803 A | * | 5/1984 | Crosby et al. ............... 341/131 |
| 4,968,987 A | | 11/1990 | Naka et al. |
| 5,083,080 A | | 1/1992 | Tagiri |
| 5,451,947 A | | 9/1995 | Morrison |
| 5,493,298 A | | 2/1996 | Bartz |

(Continued)

FOREIGN PATENT DOCUMENTS

DE        690 19 422 T2        3/1996

(Continued)

OTHER PUBLICATIONS

International Preliminary Report on Patentability, PCT/EP2007/003704, Feb. 26, 2009.

(Continued)

*Primary Examiner*—Jean B Jeanglaude
(74) *Attorney, Agent, or Firm*—Ditthavong Mori & Steiner, P.C.

(57) ABSTRACT

A measuring device for measuring the power of a high-frequency signal including a detector for detecting the high-frequency signal and for generating an analog detector signal, an analog/digital converter for generating a digital signal and an evaluation device for evaluating the digital signal. A dither supply device for the supply of a dither signal and a chopper, which periodically chops the analog detector signal with a chopper signal, are disposed between the detector and the analog/digital converter. In this context, the dither signal is supplied synchronously to the chopper signal.

17 Claims, 3 Drawing Sheets

U.S. PATENT DOCUMENTS

| | | |
|---|---|---|
| 5,585,716 A | 12/1996 | Gervais et al. |
| 6,362,677 B1 | 3/2002 | Petrofsky |
| 6,794,881 B1 * | 9/2004 | Reichel et al. ............. 324/522 |

FOREIGN PATENT DOCUMENTS

| | | |
|---|---|---|
| DE | 693 22 762 T2 | 6/1999 |
| DE | 199 55 342 A1 | 5/2001 |
| DE | 693 30 597 T2 | 6/2002 |
| EP | 0 405 593 A2 | 1/1991 |
| GB | 2 067 373 A | 7/1981 |
| GB | 2067373 A | 7/1981 |
| WO | 0136988 A | 5/2001 |
| WO | WO 01/36988 A1 | 5/2001 |
| WO | WO 03/065057 A1 | 8/2003 |

OTHER PUBLICATIONS

International Search Report, WO 2007/137659 A1, Rohde & Schwarz GmbH & Co. KG, Dec. 6, 2007, pp. 1-6.

Hirota, A., Nagai, S., and Nakaoka, M., A Novel Delta-Sigma Modulated DC-DC Power Converter utilizing Dither Signal, IEEE 31. Annual Power Electronics Specialists Conference, 2000, PESC 00. 2000, vol. 2, Jun. 18-23, 2000, pp. 831-836.

* cited by examiner 0 0 0 0
0 0 0 1
0 0 1 0
0 0 1 1
0 1 0 0
0 1 0 1
0 1 1 0
0 1 1 1
1 0 0 0
LSB   MSB
Fig. 4
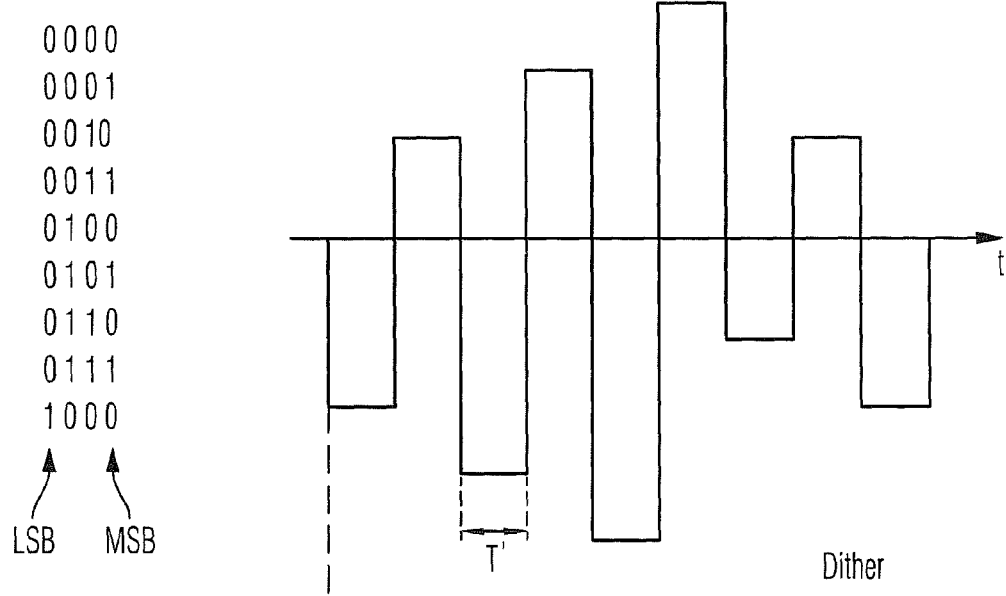
Fig. 5
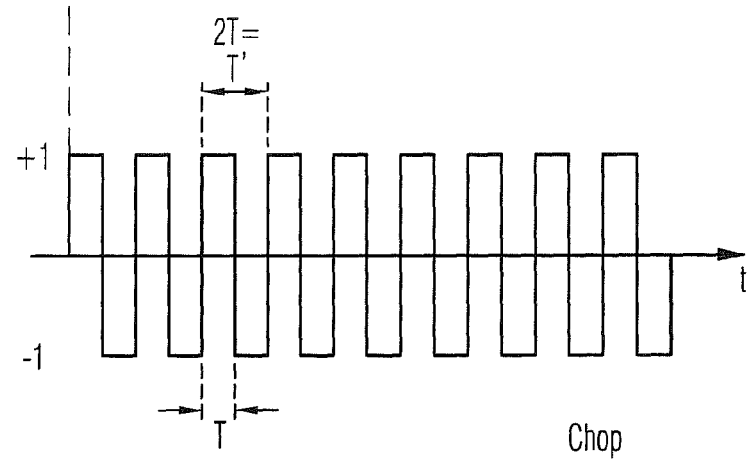
Fig. 6

MEASURING DEVICE AND MEASURING METHOD FOR MEASURING THE POWER OF A HIGH-FREQUENCY SIGNAL

CROSS-REFERENCE TO RELATED APPLICATION

The present application claims priority to PCT Application No. PCT/EP2007/003704, filed on Apr. 26, 2007, German Patent Application No. 10 2006 038 030.4, filed on Aug. 14, 2006, German Patent Application No. 10 2006 046 966.6, filed on Oct. 4, 2006, and German Patent Application No. 10 2006 024 698.5, filed on May 26, 2006, the entire contents of which are herein incorporated by reference.

BACKGROUND OF THE INVENTION

1. Field of the Invention

The invention relates to a measuring device for measuring the power, in particular, the envelope power of a high-frequency signal.

2. Discussion of the Background

A measuring device is known from DE 199 55 342 A1. With the measuring device disclosed in this specification, it is possible to measure both the envelope power and also the mean-power or RMS (root mean square) value. To cover the maximum possible dynamic range, the measurement range is divided into several subdivisions, which are allocated respectively to several measurement branches arranged parallel to one another. A chopper is disposed in each measurement branch. Furthermore, an analog/digital converter, which is supplied with a synchronous clock-pulse rate, is arranged in each measurement branch. After a weighted addition of the digitized measured signals of the individual measurement branches, a synchronous demodulation is implemented before the signal is evaluated.

The disadvantage of the measuring device known from DE 199 55 342 A1 is the use of parallel measurement branches, as a result of which the measuring device suffers from an extremely complex design. Alongside the synchronization of the choppers and the analog/digital converters, it must also be ensured that the group delay time of the measured signal is exactly equal in all measurement branches. In practice, this causes problems, especially with regard to video bandwidths to be realized within the order of magnitude of 30 MHz. With a single-path realization of the measuring device, it must be ensured that the analog/digital converter is not overdriven at the upper end of the dynamic range. This leads to a relatively poor signal level at the lower end of the dynamic range. Accordingly, special measures must be implemented to guarantee a good measurement accuracy.

SUMMARY OF THE INVENTION

The invention is based upon the object of providing a measuring device and a measuring method for measuring the power of a high-frequency signal, which allow good measurement accuracy in spite of the use of only a single measurement branch.

To reduce the 1/f noise and to minimize the influence of thermal drift in the DC amplifier, it is advantageous to arrange a chopper in front of the DC amplifier, which periodically chops the analog detector signal with a chopper signal. The signal inversion caused by chopping can subsequently be removed from the digital signal by a synchronous demodulator. According to the invention, a dither signal is supplied to the chopper signal in a synchronous manner before the analog/digital conversion. By preference, the level of the dither signal is varied only after a complete period of the chopper signal. This allows an optimal matching of the dither signal to the measurement task.

The synchronous supply of the dither signal to the chopper signal provides the advantage that the waiting times, which, in the event of a change between the phases of the chopper signal, are in any case necessary for the settling of the system, can be used for the settling of the system to the new dither signal. If the dither signal is alternated in an asynchronous manner with the chopper signal, further waiting times for every change of the dither signal, which cannot be tolerated in the case of a fast-sampling sensor, are added during the settling process.

It is advantageous, if the time, during which the dither signal is constant, corresponds to the period of the chopper signal. In this case, the same dither signal is present both during the positive phase and also during the negative phase of the chopper signal. A value pair with the same dither signal is then available for the subsequent difference formation between the positive chopper phase and the negative chopper phase. Of course, the time, during which the dither signal remains constant, can also be a different integer multiple of the period of the chopper signal, so that several value pairs of the positive chopper periods and the negative chopper periods are then available for the difference formation, and a mean value can subsequently be formed from these value pairs.

If the envelope power is measured, the dither signal and the chopper signal must not be changed during the recording of a measurement series. Typically, several measurement series are recorded successively. The dither from the dither signal supplied to the actual measured signal then causes the discretization thresholds of the analog/digital converter relative to the measured signal to be disposed at a different position, and in the case of an averaging over several measurement recordings, the discretization errors are averaged out.

The dither signal used for the measurement of the envelope power, is preferably a piecewise-constant signal, which is generated with a large amplitude variation with identical relative frequency of the individual values. For example, a counter, which generates continuously-incremented digital words, is suitable for generating a signal of this kind. In interpreting the counter result, if the value of the bits is reversed, that is to say, the least-significant bit (LSB) is exchanged with the most-significant bit (MSB) in an offset binary presentation, a digital-value sequence is obtained, which continuously changes its sign and its amplitude. Through digital/analog conversion, an analog signal can then be generated, which can be added to the measured signal before the analog/digital conversion. The elimination in the equivalent digital signal after the analog/digital conversion can then be implemented in a very simple manner by once again subtracting, or respectively by adding with an inverted sign, from/to the digital value the digital value of the dither signal, after it has been multiplied by the steepness of the dither circuit.

BRIEF DESCRIPTION OF THE DRAWINGS

An exemplary embodiment of the invention is described in greater detail below with reference to the drawings. The drawings are as follows:

FIG. 4 shows a schematic presentation of the digital words generated by the counter in FIG. 3 and their interpretation at the input of the digital/analog converter presented in FIG. 3;

FIG. 5 shows the dither signal at the output of the digital/analog converter in FIG. 3; and FIG. 6 shows the chopper signal added to the chopper in FIG. 3.

DETAILED DESCRIPTION OF EXEMPLARY EMBODIMENTS OF THE INVENTION

Figure 1:
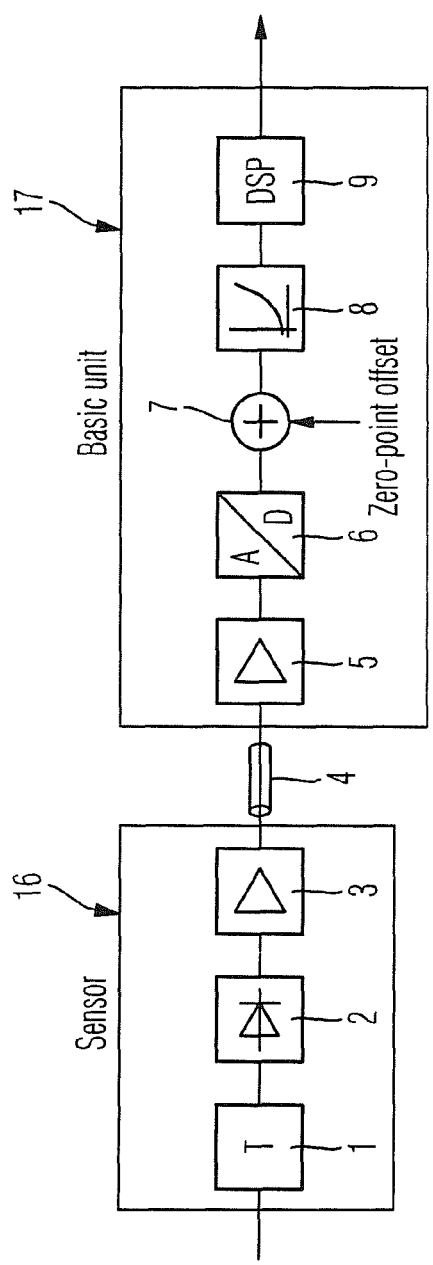
FIG. 1 shows a measuring device according to the prior art.

FIG. 1 shows a hitherto usual configuration of a measuring device for measuring the envelope-power and the average-power value. An attenuation element 1, an envelope detector 2, which can be designed as a diode detector, and a pre-amplifier or respectively line driver 3 are arranged in a sensor 16. The sensor 16 is connected via a connecting cable 4 to the basic unit 17. The main amplifier 5, an analog/digital converter 6, a summation stage 7 for subtraction of the zero-point offset, a device 8 for curve correction and a digital signal processor with further evaluation functions, for example, for displaying the envelope curves, for calculation of the average-power value and so on, are disposed in the basic unit 17. The device for curve correction 8 and the digital signal processor 9 together form an evaluation device 8, 9.

Figure 2:
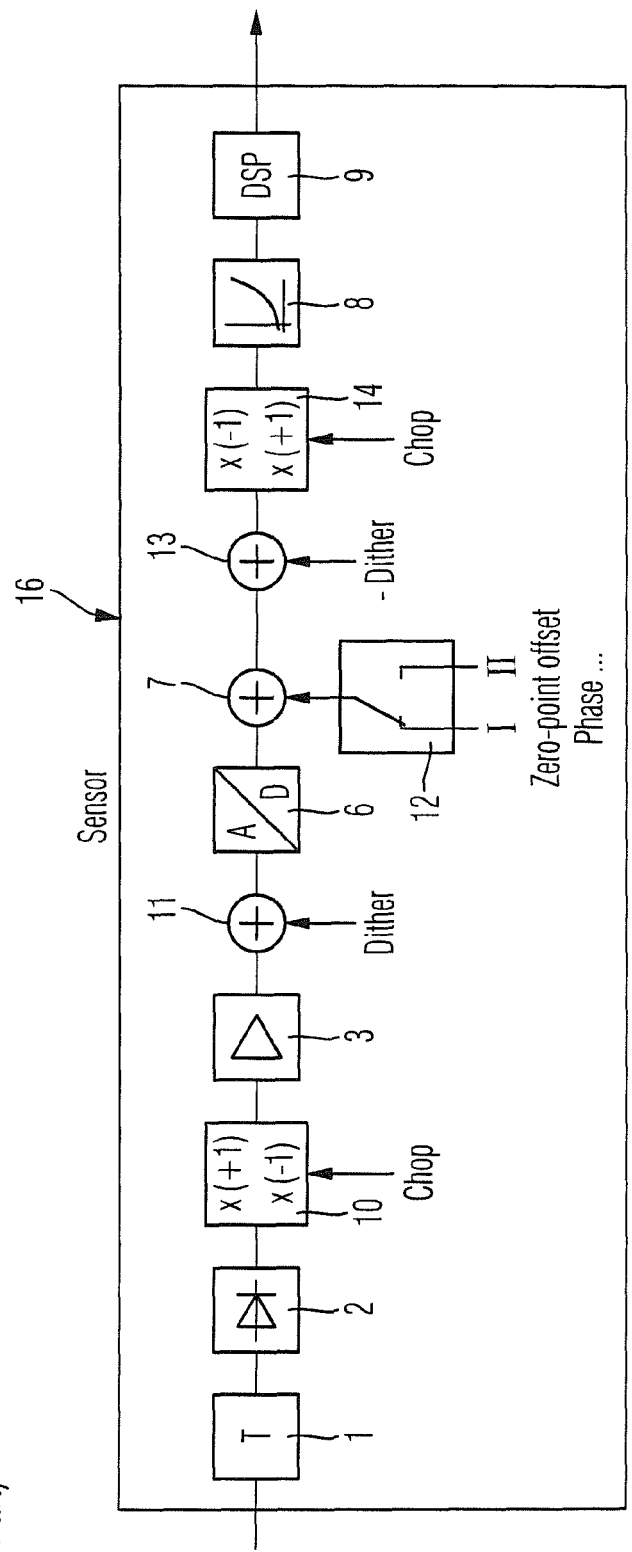
FIG. 2 shows an exemplary embodiment of the measuring device according to the invention.

FIG. 2 shows an exemplary embodiment of the measuring device according to the invention in an operating mode A, which is used for measuring the envelope power. One difference from the configuration shown in FIG. 1 is that all of the components of the measuring device according to the invention are preferably disposed in the sensor 16. A special basic unit exclusively for the power measurement may then not be required under some circumstances. The sensor 16 can be connected directly to a PC, for example, via a USB bus.

However, the essential difference is that a supply device 11 for the supply of a dither signal Dither is disposed between the detector 2 and the analog/digital converter 6, preferably after the amplifier 3.

The value of the dither signal Dither is preferably not changed during the recording of a measured-value series consisting of several measured values, for example, of the envelope power, which is associated with a period of the chopper signal, but is varied only between the individual measured-value recordings. This will be illustrated below. The dither signal Dither can be eliminated from the measured signal, which has been digitized through the analog/digital converter 6, in a dither elimination device 13. In the exemplary embodiment presented in FIG. 2, the dither elimination device 14 for the dither signal Dither consists of an adder, to which the digital equivalent of the first dither signal is supplied with an inverted sign (-Dither), so that the digital equivalent of the first dither signal is subtracted from the digitized measured signal.

Moreover, a chopper 10 is disposed between the detector 2 and the DC amplifier 3. The chopper 10 chops the measured signal, by inverting the sign of the analog signal in a cyclical manner. Chopping provides the advantage that the influence of the thermal drift of the DC amplifier 3 is considerably reduced. The influence of the 1/f noise is also reduced. A synchronous demodulator 14, which multiplies the digitized measured signal by −1 or respectively +1 synchronously with the chopper 10 and accordingly eliminates the influence of the chopper, is disposed after the analog/digital converter 6. This alternation of sign can be implemented numerically in a very simple manner without real multiplication.

A further peculiarity of the exemplary embodiment illustrated in FIG. 2 is that, in order to correct the zero-point offset, the device 7, 12 provides a switching device 12, which allows a different zero-point correction for the two chopper phases +1 and −1 of the chopper 10. The zero-point offsets can be stored independently of one another for the two chop phases in a memory device, which is not illustrated. The switching device 12 is operated synchronously with the chopper 10.

Figure 3:
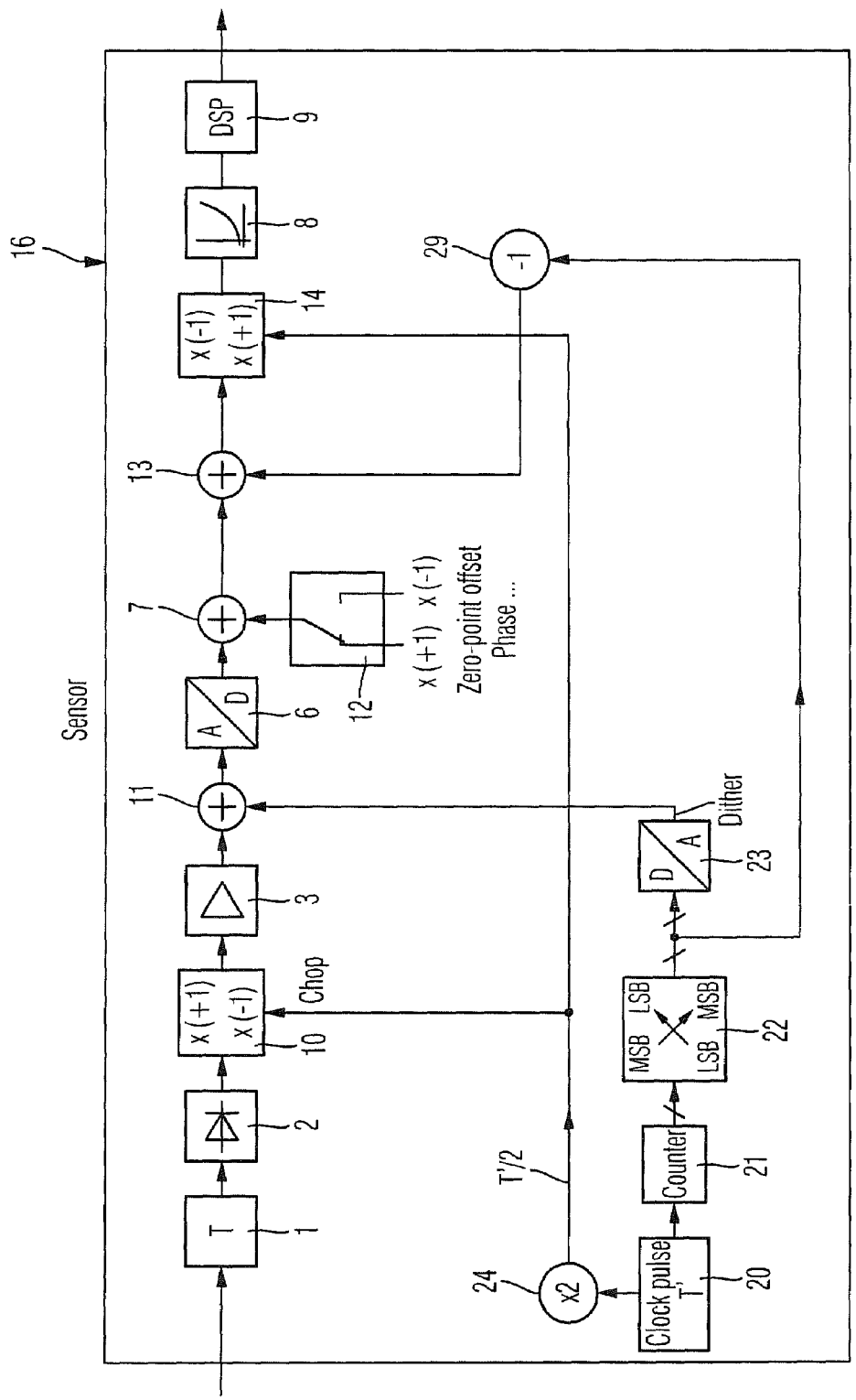
FIG. 3 shows a more detailed block-circuit diagram of the exemplary embodiment of the measuring device according to the invention.

FIG. 3 shows a more detailed block-circuit diagram, which illustrates the exemplary embodiment from FIG. 2 in greater detail.

FIG. 3 shows an exemplary embodiment of the generation of the dither signal Dither. With this exemplary embodiment, a counter 21 counts continuously upwards at the clock pulse of the clock-pulse rate specified by the clock-pulse generator 20. In the case of a simplified example of a 4-digit counter, the data word at the output of the counter 21 is shown in FIG. 4. The values of the individual bits of the digital word generated by the counter 21 are reversed in the unit 22, that is to say, the least-significant bit LSB becomes the most-significant bit MSB; the most-significant bit MSB becomes the least-significant bit LSB; the second least-significant bit becomes the second most-significant bit; the second most-significant bit becomes the second least-significant bit and so on. This reversed interpretation of the bit values of the data word generated by the counter 21 is characterized in FIG. 4 with reference to LSB and MSB.

If the data word with its reversed bit value is now interpreted in a two's complementary presentation, in which the most-significant bit MSB characterizes the sign of the data word, or in an offset-binary presentation, and if this data sequence is supplied to a digital/analog converter 23, an analog signal is obtained as illustrated in FIG. 5. This is a rectangular signal, of which the sign changes corresponding with the clock-pulse rate specified by the clock-pulse generator 20, wherein the amplitudes from impulse to impulse rise and fall in a step like manner.

The dither signal Dither generated by the digital/analog converter 23 is supplied to the dither supply device 11, in which it is superimposed on the measured signal.

During the period T of the chopper signal illustrated in FIG. 6, the dither signal Dither preferably remains constant, so that the envelope of the measured signal is not changed by the dither signal used in the measurement of the envelope power. The dither signal Dither is varied only between the individual periods of the chopper signal, so that it is provided with a different sign and a different amplitude for the next measurement recording. For every recording, the dither value is therefore changed somewhat, so that the discretization thresholds of the analog/digital converter relative to the measured signal are varied somewhat for every recording. If an averaging of all of the recordings is implemented in the context of a so-called "averaging" mode, not only is the signal/noise ratio improved as a result; the discretization error of the analog/digital converter is also reduced. However, the prerequisite condition here is that the dither signal Dither is not changed during the chopper periods.

The digital value corresponding to the dither signal Dither is inverted via an inverter 27, which inverts the sign of the digital value; it is then supplied to the adding unit 13, where it is deducted from the digitized measured signal. Of course, a subtraction unit can also be used instead of an adding unit 13, and the inverter 29 can be omitted.

The theoretical influence of the dither signal on the digital output value of the analog/digital converter 6 can be calculated with a simple mathematical model and subtracted again in the context of the digital signal processing.

This mathematical model is as follows: in an automatic calibration procedure, the entire value range of the analog/digital converter 23 is run through at least once. This is possible through the known periods of the pseudo-random value sequence. The resulting output value is determined with the analog/digital converter 6 without input signal at every value of the pseudo-random value sequence. The linear equation, which best describes the value-pair sequence, is determined by linear regression. The rise of the regression curve describes the steepness of the dither circuit and is stored in the sensor 16. The vertical displacement of the regression curve can be rejected, because it is a component of the zero-point offset of the sensor 16 and is reduced to zero anyway by the zero-point correction in the device 7 of the sensor. In order to determine the theoretical influence of the dither signal on the starting value of the analog/digital converter 6, the value of the pseudo-random data sequence is simply multiplied by the steepness of the dither supply device 11.

If a new value of the pseudo-random sequence is used for each individual analog/digital conversion, it must be ensured, that the digital/analog converter 23 with the dither supply device 11, which is responsible for supplying the dither signal to the input signal of the analog/digital converter to be linearized, is fast enough, so that the transient processes subside in the time between the analog/digital conversions.

With fast sampling rates, it is often impossible to achieve this requirement for settling between two analog/digital conversions at a reasonable cost. According to the invention, a new pseudo-random digital value is therefore preferably supplied to the digital/analog converter 23 only after every chopper period consisting of a non-inverted and an inverted chopper phase. The transient process is not disturbing in this context because the entire signal path must settle anyway between the chopper phases +1 and −1 as a result of the switch-over of the chopper. Accordingly, all output values of the analog/digital converter 6 in a given non-inverting chopper phase +1 and all output values in the subsequent inverting chopper phase −1 are measured with the same dither voltage, that is to say, the disturbing influence in both chopper phases +1 and −1 is also identical.

In reality, the digital/analog converter 23 continues to be non-ideal. As a result of deviations of the real components from the simple, linear, mathematical model, the subtraction of the theoretical influence of the dither signal will not suffice to remove the influence of the dither completely from the analog/digital converter value. Unless further measures are implemented, the residual influence will cause the dither signal to be noticeable as additional noise.

In order to avoid this, the same portion of the pseudo-random sequence is preferably added twice in succession, firstly, when the non-inverted input signal is present in the positive chopper phase +1 and, secondly, when the inverted input signal is present in the negative chopper phase −1. This ensures that the disturbing influence of the dither signal on the mean value of the measured power is of the same magnitude in the non-inverting chopper phase +1 and in the inverting chopper phase −1. The disturbing influence of the dither is completely eliminated by means of a subsequent difference formation between the non-inverted and inverted chopper phase. The difference formation between the non-inverted and the inverted chopper phase takes place anyway in the chopper operating mode in order to eliminate any other disturbing influences in the signal path, for example, the offset voltage drift of the amplifier and the 1/f noise. This does therefore not represent an additional cost.

The synchronization of the dither signal with the chopper signal therefore means that the waiting time necessary anyway with an alternation between the chopper phases until the settling of the system is exploited at the same time in order to alternate the dither signal, so that no additional waiting time is required for the alternation of the dither signal.

In order to achieve the synchronization between the dither signal Dither and the chopper signal Chop, the clock-pulse generator 20 is preferably used not only to generate the dither signal, but also to generate the chopper signal. For this purpose, the clock-pulse signal of period length T' of the clock-pulse generator 20 is supplied not only to the counter 21, but also to a frequency doubler 24, so that the clock-pulse signal at the output of the frequency doubler 24 continues to provide a period length of T'/2. This clock-pulse signal is supplied both to the chopper 10 and also to the synchronous demodulator 14 so that the chopper 10 and the synchronous demodulator 14 each alternate the chopper phase either from +1 to −1 or from −1 to +1 after the time T'/2. Accordingly, the dither signal is held constant over a complete period of the chopper signal consisting of the positive chopper phase +1 and the negative chopper phase −1.

The invention is not restricted to the exemplary embodiment illustrated. With regard to the dither signal, it is in fact advantageous, but not absolutely necessary, for the sign of the dither signal to change from clock pulse to clock pulse. The dither signal could also remain constant over more than two half periods of the chopper signal. All of the features described above or illustrated in the drawings can be combined with one another as required within the framework of the invention.

The invention claimed is:

1. A measuring device for measuring the power of a high-frequency signal comprising:
    a detector for detecting the high-frequency signal and for generating an analog detector signal,
    an analog/digital converter for generating a digital signal,
    a chopper disposed between the detector and the analog/digital converter, the chopper configured to periodically chop the analog detector signal with a chopper signal,
    an evaluation device for evaluating the digital signal,
    a dither supply device configured to supply a dither signal, the dither supply device disposed between the detector and the analog/digital converter, and
    a synchronous demodulator, which operates synchronously to the chopper, is disposed between the analog/digital converter and the evaluation device,
    wherein the dither supply device supplies the dither signal synchronously with the chopper signal,
    the dither signal is a sectionally-constant signal, and the time, during which the dither signal is constant, corresponds to the period of the chopper signal or is an integer multiple thereof, and
    wherein the detector, chopper, analog/digital converter, synchronous demodulator and evaluation device are coupled in a single branch.

2. The measuring device according to claim 1, wherein, in order to measure an envelope power, a type of dither signal is supplied, which is not changed during the recording of a measured-value series consisting of several measured values of the envelope power, but which is varied only between the recordings of the measurement series.

3. The measuring device according to claim 1, wherein the synchronous demodulator is driven by the chopper signal.

4. The measuring device according to claim 3, wherein the dither signal is generated via a digital/analog converter from a cyclical digital-value sequence, wherein adjacent digital values of the digital-value sequence provide a relatively-large value difference on statistical average.

5. The measuring device according to claim 1, wherein the dither signal is generated via a digital/analog converter from a cyclical digital-value sequence, wherein adjacent digital values of the digital-value sequence provide a relatively-large value difference on statistical average.

6. The measuring device according to claim 5, wherein the cyclical digital-value sequence is generated by a counter, wherein the most-significant bit of each digital value generated by the counter is used as the least-significant bit of the digital/analog converter; and the least-significant bit of each digital value generated by the counter is used as the most-significant bit of the digital/analog converter.

7. The measuring device according to claim 1, wherein a dither elimination device for the elimination of the dither signal is disposed between the analog/digital converter and the evaluation device.

8. The measuring device according to claim 1, wherein a device for the correction of a zero-point offset is disposed between the analog/digital converter and the evaluation device.

9. The measuring device according to claim 1, wherein, in order to measure an envelope power, a type of dither signal is supplied, which is not changed during the recording of a measured-value series consisting of several measured values of the envelope power, but which is varied only between the recordings of the measurement series.

10. A measuring method for measuring the power of a high-frequency signal comprising:
   generating an analog detector signal by detecting the high-frequency signal,
   periodically chopping the analog detector signal with a chopper signal,
   analog-digital converting and generating a digital signal indirectly or directly from the chopped detector signal and
   evaluating the digital signal, wherein a dither signal is supplied before the analog/digital conversion, wherein the dither signal is supplied synchronously with the chopper signal, and a sectionally-constant signal is used as the dither signal, and the time, during which the dither signal is constant, corresponds to the period of the chopper signal or is an integer multiple thereof.

11. The measuring method according to claim 10, wherein a correction of a zero-point offset is implemented after the analog/digital conversion.

12. The measuring method according to claim 10, wherein, in order to measure an envelope power, a type of dither signal is supplied, which is not changed during the recording of a measured-value series consisting of several measured values of the envelope power, but which is varied only between the recordings of the measurement series.

13. The measuring method according to claim 10, wherein the dither signal is generated via a digital/analog converter from a cyclical digital-value sequence, wherein adjacent digital values of the digital-value sequence provide a relatively-large value difference on statistical average.

14. The measuring method according to claim 13, wherein the cyclical digital-value sequence is generated by a counter, wherein the most-significant bit of each digital value generated by the counter is used as the least-significant bit for the digital/analog conversion; and the least-significant bit of each digital value generated by the counter is used as the most-significant bit for the digital/analog conversion.

15. The measuring method according to claim 10, wherein the dither signal is eliminated again after the analog/digital conversion.

16. The measuring method according to claim 10, wherein a synchronous demodulation is implemented after the analog/digital conversion, wherein the synchronous demodulation is implemented synchronously with the chopping.

17. The measuring method according to claim 16, wherein the synchronous demodulation is controlled by the chopper signal.

* * * * *